(12) United States Patent
Wang et al.

(10) Patent No.: US 9,013,099 B2
(45) Date of Patent: Apr. 21, 2015

(54) ORGANIC ELECTROLUMINESCENT APPARATUS

(71) Applicant: Au Optronics Corporation, Hsinchu (TW)

(72) Inventors: Chun-Jan Wang, Changhua County (TW); Chia-Hao Chang, Hsinchu County (TW); Chih-Jen Yang, Taipei (TW); Chuan-Hsiu Chang, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 80 days.

(21) Appl. No.: 13/778,162

(22) Filed: Feb. 27, 2013

(65) Prior Publication Data

US 2013/0334959 A1 Dec. 19, 2013

(30) Foreign Application Priority Data

Mar. 2, 2012 (TW) .............................. 101107033 A

(51) Int. Cl.
*H01J 1/62* (2006.01)
*H01J 63/04* (2006.01)
*H01L 51/52* (2006.01)

(52) U.S. Cl.
CPC ................................ *H01L 51/5256* (2013.01)

(58) Field of Classification Search
USPC .................................................. 313/498–512
See application file for complete search history.

(56) References Cited

U.S. PATENT DOCUMENTS 7,796,320 B2  9/2010  Yang et al.
8,624,487 B2 *  1/2014  Han et al. ...................... 313/506
2004/0081852 A1  4/2004  Chen et al.
2007/0159089 A1 *  7/2007  Oh et al. ........................ 313/506
2008/0029147 A1  2/2008  Yang et al.
2008/0164810 A1 *  7/2008  Oda et al. ...................... 313/504
2009/0153042 A1 *  6/2009  Izumi et al. ................... 313/504
2009/0302333 A1 * 12/2009  Seki et al. ........................ 257/88
2010/0187986 A1 *  7/2010  Kajitani et al. ............... 313/504
2013/0076231 A1 *  3/2013  Nakanishi et al. ............ 313/500

FOREIGN PATENT DOCUMENTS

| CN | 1612650 |   | 5/2005 |
| CN | 1612650 A | * | 5/2005 |
| CN | 101438199 |   | 5/2009 |
| TW | I287135 |   | 9/2007 |
| TW | 200913255 |   | 3/2009 |
| TW | 200924185 |   | 6/2009 |

OTHER PUBLICATIONS

"Office Action of China Counterpart Application", issued on Apr. 25, 2014, p. 1-p. 7, in which the listed references were cited.

* cited by examiner

*Primary Examiner* — Thomas A Hollweg
*Assistant Examiner* — Kevin Quarterman
(74) *Attorney, Agent, or Firm* — Jianq Chyun IP Office

(57) ABSTRACT

An organic electroluminescent apparatus including a substrate, an organic light-emitting device layer, a patterned structure layer and an encapsulation film is provided. The substrate has a light-emitting region and a non-light-emitting region. The organic light-emitting device layer is disposed on the substrate in the light-emitting region. The patterned structure layer is disposed on the substrate in the non-light-emitting region. The encapsulation film is disposed on the substrate and covers the organic light-emitting device layer and the patterned structure layer. A surface of the encapsulation film on the patterned structure layer is a concave-convex surface, and a surface of the encapsulation film on the organic light-emitting device layer is an even surface.

8 Claims, 2 Drawing Sheets

ORGANIC ELECTROLUMINESCENT APPARATUS

CROSS-REFERENCE TO RELATED APPLICATION

This application claims the priority benefit of Taiwan application serial no. 101107033, filed on Mar. 2, 2012. The entirety of the above-mentioned patent application is hereby incorporated by reference herein and made a part of this specification.

BACKGROUND OF THE INVENTION

1. Field of the Invention

The invention relates to a light-emitting apparatus, particularly to an organic electroluminescent apparatus.

2. Description of Related Art

An organic electroluminescent apparatus is a self-emissive display. Organic electroluminescent apparatuses have properties such as wide view angles, high response speed (about more than one hundred times faster than the response speed of liquid crystals), light weight, the ability to be miniaturized as required by hardware equipment, high light-emitting efficiency, high color rendering index, and planar light source. Therefore, organic electroluminescent apparatuses have great potential for development and are expected to become new flat panel displays of the next generation.

In general, an organic electroluminescent apparatus includes a light-emitting region and a non-light-emitting region. An organic light-emitting device layer is disposed in the light-emitting region. If external moisture and oxygen enter the organic electroluminescent apparatus, an electrochemical reaction between the moisture and the oxygen and the organic light-emitting device layer occurs, such that electrodes and organic light-emitting materials inside the organic light-emitting device layer are damaged and dark dots are generated on the light-emitting region so as to influence the performance of the organic electroluminescent apparatus. To achieve water-resistant and oxygen-resistant effects, generally, a cover is adhered to a substrate which carriers the organic light-emitting device layer. However, after the cover is adhered, a thickness of the entire organic electroluminescent apparatus is increased. In addition, the cover cannot be applied to a flexible organic electroluminescent apparatus.

Based on the above, a water-resistant and oxygen-resistant film may be used to cover the organic light-emitting device layer to achieve water-resistant and oxygen-resistant effects. In general, the conventional encapsulation film is formed by stacking multiple inorganic films and organic films, wherein the inorganic films have better water-resistance, and the organic films may fill defects and have better elasticity. Therefore, using the conventional encapsulation film may increase the reliability of the packaged organic electroluminescent apparatus. Most of the current inorganic films and the organic films are formed with a vacuum coating process. The coating process causes problems such as shadow effects occurring at a film edge in the non-light-emitting region and a poor patterned covering, which cause a coating edge to have poor water-resistance and oxygen-resistance. Therefore, moisture and oxygen are likely to penetrate the device through the coating edge in the non-light-emitting region to damage the organic electroluminescent apparatus.

SUMMARY OF THE INVENTION

The invention provides an organic electroluminescent apparatus having an extending path where moisture and oxygen enter an organic light-emitting device layer to improve water-resistance and oxygen-resistance.

The invention provides an organic electroluminescent apparatus including a substrate, an organic light-emitting device layer, a patterned structure layer and an encapsulation film. The substrate has a light-emitting region and a non-light-emitting region. The organic light-emitting device layer is disposed on the substrate in the light-emitting region. The patterned structure layer is disposed on the substrate in the non-light-emitting region. The encapsulation film is disposed on the substrate and covers the organic light-emitting device layer and the patterned structure layer. A surface of the encapsulation film on the patterned structure layer is a concave-convex surface. A surface of the encapsulation film on the organic light-emitting device layer is an even surface.

The invention further proposes an organic electroluminescent apparatus including a substrate, an organic light-emitting device layer, a first inorganic layer, an aggregated enhanced layer, an organic layer, and a second inorganic layer. The substrate has a light-emitting region and a non-light-emitting region. The organic light-emitting device layer is disposed on the substrate in the light-emitting region. The first inorganic layer covers the organic light-emitting device layer and the non-light-emitting region of the substrate. The aggregated enhanced layer covers the first inorganic layer in the non-light-emitting region. The organic layer covers the first inorganic layer and the aggregated enhanced layer. The second inorganic layer covers the organic layer. A surface of the organic layer and a surface of the second inorganic layer on the aggregated enhanced layer are concave-convex surfaces, and a surface of the organic layer and a surface of the second inorganic layer on the organic light-emitting device layer are even surfaces.

Based on the above, in the organic electroluminescent apparatus of the invention, the patterned structure layer is disposed in the non-light-emitting region, so that the encapsulation film on the patterned structure layer has a concave-convex surface. In addition, in the organic electroluminescent apparatus of the invention, the aggregated enhanced layer is disposed in the non-light-emitting region, so that the organic layer and the second inorganic layer on the aggregated enhanced layer have concave-convex surfaces. When moisture and oxygen enter the encapsulation film or the organic layer in the non-light-emitting region, the concave-convex structures extend a path where moisture and oxygen enter the organic light-emitting device layer, such that the water-resistance and the oxygen-resistance of the organic electroluminescent apparatus is improved.

In order to make the aforementioned features and advantages of the invention more comprehensible, embodiments accompanying drawings are described in detail below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF EMBODIMENTS

First Embodiment

Figure 1:
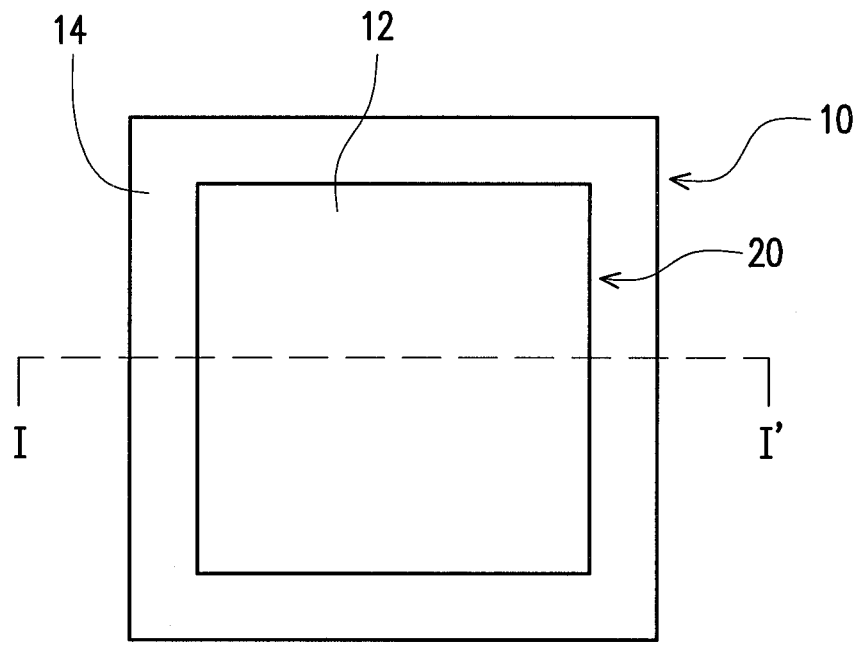
FIG. 1 is a schematic top view of an organic electroluminescent apparatus according to a first embodiment of the invention.
Figure 2:
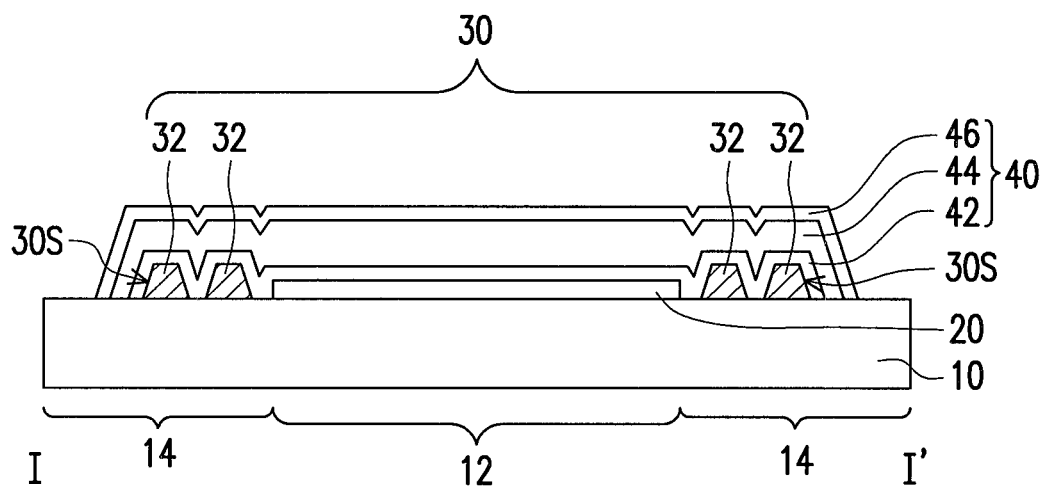
FIG. 2 is a schematic cross-sectional view taken along a sectional line I-I' depicted in FIG. 1.

FIG. 1 is a schematic top view of an organic electroluminescent apparatus according to the first embodiment of the invention. FIG. 2 is a schematic cross-sectional view taken along a sectional line I-I' depicted in FIG. 1. It should be noted that, to clearly illustrate a structure of an organic electroluminescent apparatus 100a, FIG. 1 illustrates a substrate 10 and an organic light-emitting device layer 20 and omits other components.

Please refer to both FIGS. 1 and 2. The organic electroluminescent apparatus 100a includes a substrate 10, an organic light-emitting device layer 20, a patterned structure layer 30 and an encapsulation film 40. The substrate 10 has a light-emitting region 12 and a non-light-emitting region 14, wherein the non-light-emitting region 14 surrounds the light-emitting region 12.

The organic light-emitting device layer 20 is disposed on the substrate 10 and located in the light-emitting region 12. In general, the organic light-emitting device layer 20 may include a first electrode, a second electrode, and organic light-emitting materials disposed between the first electrode and the second electrode. The organic light-emitting materials may include a red organic light-emitting material, a green organic light-emitting material, a blue organic light-emitting material, or a light-emitting material of other colors generated by mixing lights of various spectra. Using light-emitting materials of different colors makes the organic light-emitting device layer 20 emitting different color lights. In addition, the organic light-emitting device layer 20 may further include an electron injecting layer, a hole injecting layer, an electron transporting layer, and a hole transporting layer.

The patterned structure layer 30 is disposed on the substrate 10 and located in the non-light-emitting region 14. The patterned structure layer 30 includes a plurality of protruding structures 32. The protruding structures 32 are disposed surrounding the organic light-emitting device layer 20. A thickness of the patterned structure layer 30 ranged from 0.5 to 5 micrometers. The patterned structure layer 30 includes a water-resistant and oxygen-resistant material which reduces moisture and oxygen entering the organic light-emitting device layer 20.

The encapsulation film 40 is disposed on the substrate 10 and covers the organic light-emitting device layer 20 and the patterned structure layer 30. In detail, since the patterned structure layer 30 includes the plurality of protruding structures 32, when the encapsulation film 40 covers the patterned structure layer 30, a surface of the encapsulation film 40 on the patterned structure layer 30 becomes a concave-convex surface according to the arrangement of the protruding structures 32. In addition, since a surface of the organic light-emitting device layer 20 is an even surface, a surface of the encapsulation film 40 on the organic light-emitting device layer 20 is an even surface.

Based on the above, the encapsulation film 40 includes at least a stacked layer, the stacked layer including a first inorganic layer 42, a second inorganic layer 46, and an organic layer 44. The organic layer 44 is disposed between the first inorganic layer 42 and the second inorganic layer 46. The first inorganic layer 42 and the second inorganic layer 46 include metal oxide, metal nitride, silicon oxide, or silicon nitride, respectively, and a thickness of the first inorganic layer 42 and a thickness of the second inorganic layer 46 range from 300 angstroms to 1 micrometer, respectively. The first inorganic layer 42 and the second inorganic layer 46 are water-resistant and oxygen-resistant materials. The organic layer 44 includes acrylate or parylene. A thickness of the organic layer 44 ranges from 0.5 to 2 micrometers. The organic layer 44 is a flexible material.

In the present embodiment, the patterned structure layer 30 has an outermost side surface 30S, and the first inorganic layer 42, the organic layer 44, and the second inorganic layer 46 sequentially cover the outermost side surface 30S of the patterned structure layer 30. In detail, a coating boundary of the first inorganic layer 42 is larger than a boundary of the patterned structure layer 30. A coating boundary of the organic layer 44 is larger than the coating boundary of the first inorganic layer 42. A coating boundary of the second inorganic layer 46 is larger than the coating boundary of the organic layer 44. For example, the coating boundaries of each layer all contact the substrate 10.

It should be noted that the aforementioned stacked layers sequentially cover the patterned structure layer 30 in an order of the first inorganic layer 42, the organic layer 44, and the second inorganic layer 46, so that the stacked layers have concave-convex structures due to the protruding structures 32 of the patterned structure layer 30. According to the present embodiment, the first inorganic layer 42, the organic layer 44, and the second inorganic layer 46 may be manufactured with a vacuum coating process.

The invention does not limit the number of stacked layers of the encapsulation film 40 and the numbers of inorganic layers and organic layers of the stacked layers. For example, in other embodiments that are not shown, the stacked layers may be formed by stacking a plurality of inorganic layers and a plurality of organic layers sequentially.

Based on the above, since the first inorganic layer 42, the organic layer 44, and the second inorganic layer 46 have the concave-convex structures, a path where the moisture and the oxygen enter the organic light-emitting device layer 20 is extended and water-resistance and oxygen-resistance of the organic electroluminescent apparatus 100a are therefore improved.

Second Embodiment

Figure 3:
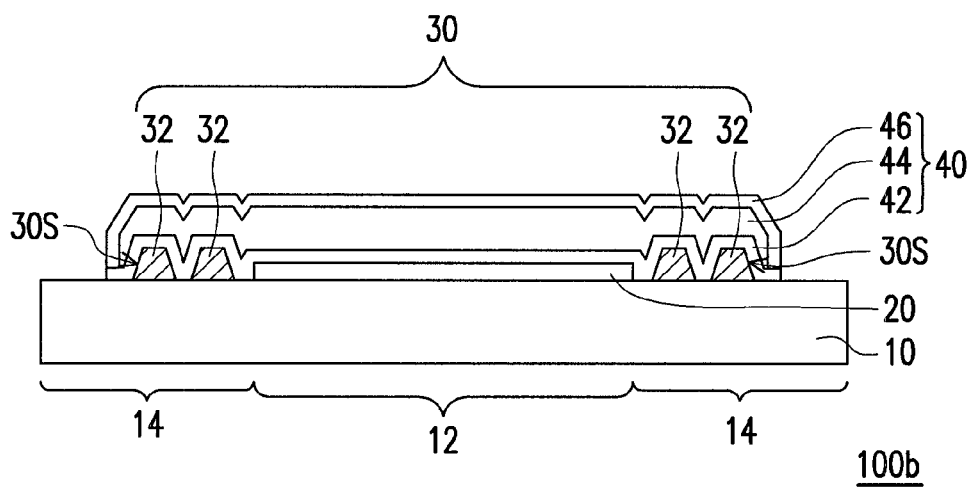
FIG. 3 is a schematic cross-sectional view of an organic electroluminescent apparatus according to a second embodiment of the invention.

FIG. 3 is schematic cross-sectional view of an organic electroluminescent apparatus according to the second embodiment of the invention. Please refer to FIG. 3. The present embodiment is similar to the embodiment shown in FIG. 2. Therefore, identical elements are indicated with identical reference numbers, and descriptions thereof are not repeated herein. An organic electroluminescent apparatus 100b includes a substrate 10, an organic light-emitting device layer 20, a patterned structure layer 30, and an encapsulation film 40. The substrate 10 has a light-emitting region 12 and a non-light-emitting region 14, wherein the non-light-emitting region 14 surrounds the light-emitting region 12.

The organic light-emitting device layer 20 is disposed on the substrate 10 and located in the light-emitting region 12. The patterned structure layer 30 is disposed on the substrate 10 and located in the non-light-emitting region 14. The encapsulation film 40 is disposed on the substrate 10 and covers the organic light-emitting device layer 20 and the patterned structure layer 30. A surface of the encapsulation film 40 on the patterned structure layer 30 is a concave-convex surface. A surface of the encapsulation film 40 on the organic light-emitting device layer 20 is an even surface.

A structure of the organic electroluminescent apparatus 100b of the present embodiment is substantially the same as the structure of the organic electroluminescent apparatus 100a of the first embodiment, and the differences are further described below. According to the present embodiment, the patterned structure layer 30 has an outermost side surface 30S, and the first inorganic layer 42 covers the outermost side surface 30S of the patterned structure layer 30. The organic layer 44 covers the outermost side surface 30S of the patterned structure layer 30 but does not cover a coating boundary of the first inorganic layer 42. The second inorganic layer 46 covers a coating boundary of the organic layer 44. In other words, the coating boundaries of the inorganic layers have to be larger than the coating boundary of the organic layer.

Based on the above, according to the present embodiment, the first inorganic layer 42, the organic layer 44, and the second inorganic layer 46 may be manufactured with a vacuum coating process. The coating boundary of the first inorganic layer 42 is larger than the boundary of the patterned structure layer 30. The coating boundary of the organic layer 44 is smaller than the coating boundary of the first inorganic layer 42. The coating boundary of the second inorganic layer 46 is equal to the coating boundary of the first inorganic layer 42.

Similar to the first embodiment, the aforementioned stacked layers sequentially cover the patterned structure layer 30 in an order of the first inorganic layer 42, the organic layer 44, and the second inorganic layer 46; therefore, the stacked layers have concave-convex structures due to the protruding structures 32 in the patterned structure layer 30.

Based on the above, since the first inorganic layer 42, the organic layer 44, and the second inorganic layer 46 have concave-convex structures, a path where the moisture and the oxygen enter the organic light-emitting device layer 20 is extended and water-resistance and oxygen-resistance of the organic electroluminescent apparatus 100b are therefore improved.

Third Embodiment

Figure 4:
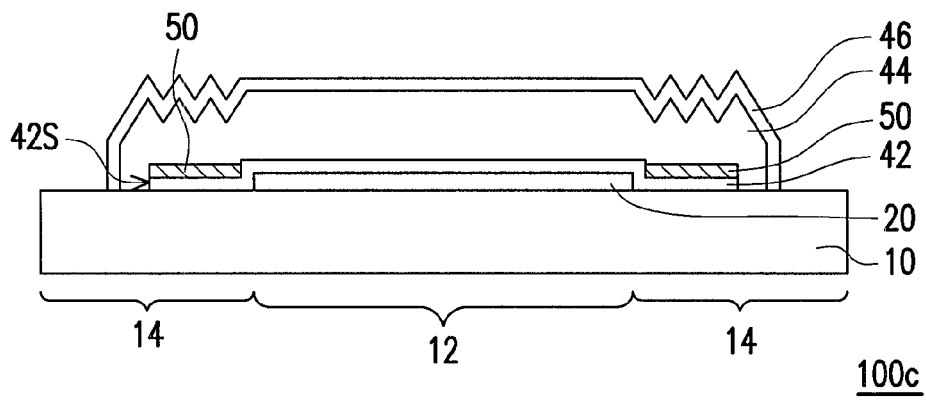
FIG. 4 is a schematic cross-sectional view of an organic electroluminescent apparatus according to a third embodiment of the invention.

FIG. 4 is a schematic cross-sectional view of an organic electroluminescent apparatus according to the third embodiment of the invention. Please refer to FIG. 4. An organic electroluminescent apparatus 100c includes a substrate 10, an organic light-emitting device layer 20, a first inorganic layer 42, an aggregated enhanced layer 50, an organic layer 44, and a second inorganic layer 46. The substrate 10 has a light-emitting region 12 and a non-light-emitting region 14, wherein the non-light-emitting region 14 surrounds the light-emitting region 12.

The organic light-emitting device layer 20 is disposed on the substrate 10 and located in the light-emitting region 12. In general, the organic light-emitting device layer 20 may include a first electrode, a second electrode, and organic light-emitting materials disposed between the first electrode and the second electrode. The organic light-emitting materials may include a red organic light-emitting material, a green organic light-emitting material, a blue organic light-emitting material, or a light-emitting material of other colors generated by mixing lights of various spectra. Using light-emitting materials of different colors makes the organic light-emitting device layer 20 emitting different color lights. In addition, the organic light-emitting device layer 20 may further include an electron injecting layer, a hole injecting layer, an electron transporting layer, and a hole transporting layer.

The first inorganic layer 42 covers the organic light-emitting device layer 20 and the non-light-emitting region 14 of the substrate 10. The first inorganic layer 42 includes metal oxide, metal nitride, silicon oxide, or silicon nitride, and a thickness thereof ranges from 300 angstroms to 1 micrometer. The first inorganic layer 42 is a water-resistant and oxygen-resistant material.

The aggregated enhanced layer 50 covers the first inorganic layer 42 on the non-light-emitting region 14. The aggregated enhanced layer 50 includes titanium, magnesium, or aluminum.

The organic layer 44 covers the first inorganic layer 42 on the light-emitting region 12 and the aggregated enhanced layer 50. The organic layer 44 includes acrylate or parylene. A thickness of the organic layer 44 ranges from 0.5 to 2 micrometers. The organic layer 44 is a flexible material.

According to the present embodiment, a material affinity between the organic layer 44 and the aggregated enhanced layer 50 is different from a material affinity between the organic layer 44 and the first inorganic layer 42. When the organic layer 44 is manufactured by coating, since the aggregated enhanced layer 50 does not get wetting easily, a surface of the organic layer 44 coated on the aggregated enhanced layer 50 becomes atomized and forms a concave-convex surface on the non-light-emitting region 14. In addition, a surface of the organic layer 44 on the first inorganic layer 42 does not become atomized and forms an even surface on the light-emitting region 12.

Based on the above, according to the present embodiment, when the second inorganic layer 46 is manufactured by coating, since the second inorganic layer 46 covers the organic layer 44, the second inorganic layer 46 grows along a surface of the organic layer 44. Therefore, a surface of the second inorganic layer 46 on the non-light-emitting region 14 is a concave-convex surface, and a surface of the second inorganic layer 46 on the light-emitting region 12 is an even surface. The second inorganic layer 46 includes metal oxide, metal nitride, silicon oxide, or silicon nitride. A thickness of the second inorganic layer ranges from 300 angstroms to 1 micrometer. The second inorganic layer 46 is a water-resistant and oxygen-resistant material.

According to the present embodiment, the first inorganic layer 42, the organic layer 44, and the second inorganic layer 46 may be manufactured with a vacuum coating process. The first inorganic layer 42 has an outermost side surface 42S, and the organic layer 44 and the second inorganic layer 46 sequentially cover the outermost side surface 42S of the first inorganic layer 42. In detail, a coating boundary of the organic layer 44 is larger than a coating boundary of the first inorganic layer 42. A coating boundary of the second inorganic layer 46 is larger than the coating boundary of the organic layer 44.

Based on the above, since the organic layer 44 and the second inorganic layer 46 have concave-convex structures, a path where the moisture and the oxygen enter the organic light-emitting device layer 20 is extended and water-resistance and oxygen-resistance of the organic electroluminescent apparatus 100c are therefore improved.

Fourth Embodiment

Figure 5:
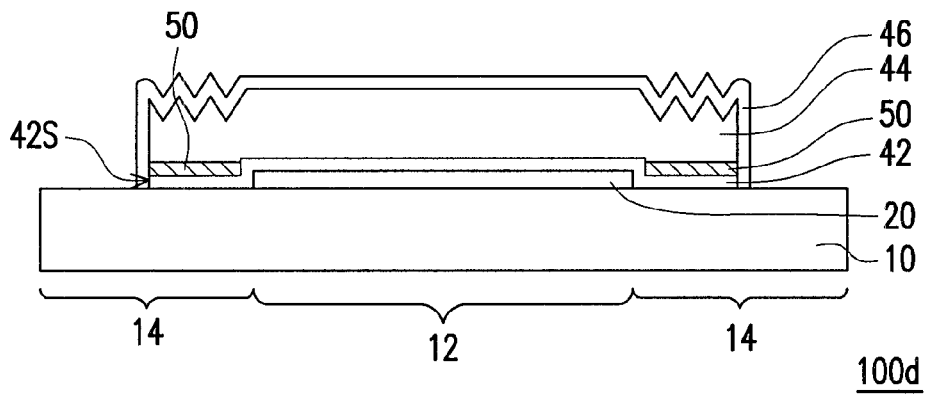
FIG. 5 is schematic cross-sectional view of an organic electroluminescent apparatus according to a fourth embodiment of the invention.

FIG. 5 is schematic cross-sectional view of an organic electroluminescent apparatus according to the fourth embodiment of the invention. Please refer to FIG. 5. The present embodiment is similar to the embodiment shown in FIG. 4. Therefore, identical elements are indicated with identical reference numbers, and descriptions thereof are not repeated herein. An organic electroluminescent apparatus 100d includes a substrate 10, an organic light-emitting device layer 20, a first inorganic layer 42, an aggregated enhanced layer 50, an organic layer 44, and a second inorganic layer 46. The substrate 10 has a light-emitting region 12 and a non-light-emitting region 14, wherein the non-light-emitting region 14 surrounds the light-emitting region 12.

The organic light-emitting device layer 20 is disposed on the substrate 10 and located in the light-emitting region 12. The first inorganic layer 42 covers the organic light-emitting device layer 20 and the non-light-emitting region 14 of the substrate 10. The aggregated enhanced layer 50 covers the first inorganic layer 42 on the non-light-emitting region 14. The organic layer 44 covers the first inorganic layer 42 on the light-emitting region 12 and the aggregated enhanced layer 50. The second inorganic layer 46 covers the organic layer 44. A surface of the organic layer 44 and a surface of the second inorganic layer 46 on the aggregated enhanced layer 50 are concave-convex surfaces, and a surface of the organic layer 44 and a surface of the second inorganic layer 46 on the organic light-emitting device layer 20 are even surfaces.

A structure of the organic electroluminescent apparatus 100d of the present embodiment is substantially the same as the structure of the organic electroluminescent apparatus 100c of the third embodiment, and the differences are further described below. According to the present embodiment, the first inorganic layer 42, the organic layer 44, and the second inorganic layer 46 may be manufactured with a vacuum coating process. In the present embodiment, the first inorganic layer 42 has an outermost side surface 42S, and the organic layer 44 does not cover the outermost side surface 42S of the first inorganic layer 42, and the second inorganic layer 46 covers the outermost side surface 42S of the first inorganic layer 42. In detail, a coating boundary of the organic layer 44 is equal to a coating boundary of the first inorganic layer 42. A coating boundary of the second inorganic layer 46 is larger than the coating boundary of the organic layer 44 and covers the outermost side surface 42S of the first inorganic layer 42.

Based on the above, since the organic layer 44 and the second inorganic layer 46 have concave-convex structures, a path where the moisture and the oxygen enter the organic light-emitting device layer 20 is extended and water-resistance and oxygen-resistance of the organic electroluminescent device 100d are therefore improved.

Based on the above, in the organic electroluminescent apparatus of the invention, the patterned structure layer having the protruding structures is disposed on the non-light-emitting region, so that the encapsulation film on the non-light-emitting region has a concave-convex surface. In addition, in the organic electroluminescent apparatus of the invention, the aggregated enhanced layer is disposed on the first inorganic layer on the non-light-emitting region, so that the organic layer on the aggregated enhanced layer forms an atomized surface, and the second inorganic layer has a concave-convex surface. Since the concave-convex structures extend a path where the moisture and the oxygen enter the organic light-emitting device layer, the water-resistance of the organic electroluminescent apparatus of the invention is improved.

Though the invention has been disclosed above by the embodiments, the embodiments are not intended to limit the invention. It will be apparent to those skilled in the art that various modifications and variations can be made without departing from the spirit and scope of the invention. Therefore, the protection scope of the invention falls in the appended claims.

What is claimed is:

1. An organic electroluminescent apparatus, comprising:
   a substrate having a light-emitting region and a non-light-emitting region;
   an organic light-emitting device layer disposed on the substrate and located in the light-emitting region;
   a first inorganic layer covering the organic light-emitting device layer and covering the non-light-emitting region of the substrate;
   an aggregated enhanced layer covering the first inorganic layer located in the non-light-emitting region of the substrate, wherein a surface of the aggregated enhanced layer is an even surface;
   an organic layer covering the first inorganic layer and the aggregated enhanced layer, wherein a material affinity between the organic layer and the aggregated enhanced layer is different from a material affinity between the organic layer and the first inorganic layer; and
   a second inorganic layer covering the organic layer, wherein a surface of the organic layer and a surface of the second inorganic layer on the aggregated enhanced layer are concave-convex surfaces, and the concave-convex surfaces overlaps and corresponds only to the even surface of the aggregated enhanced layer, and a surface of the organic layer and a surface of the second inorganic layer on the organic light-emitting device layer are even surfaces.

2. The organic electroluminescent apparatus of claim 1, wherein the aggregated enhanced layer comprises titanium, magnesium, or aluminum.

3. The organic electroluminescent apparatus of claim 1, wherein the first inorganic layer has an outermost side surface, and the organic layer and the second inorganic layer sequentially cover the outermost side surface of the first inorganic layer.

4. The organic electroluminescent apparatus of claim 1, wherein the first inorganic layer has an outermost side surface, the organic layer does not cover the outermost side surface of the first inorganic layer, and the second inorganic layer covers the outermost side surface of the first inorganic layer.

5. The organic electroluminescent apparatus of claim 1, wherein the first inorganic layer and the second inorganic layer comprise metal oxide, metal nitride, silicon oxide, or silicon nitride, respectively.

6. The organic electroluminescent apparatus of claim 1, wherein a thickness of the first inorganic layer and a thickness of the second inorganic layer range from 300 angstroms to 1 micrometer, respectively.

7. The organic electroluminescent apparatus of claim 1, wherein the organic layer comprises acrylate or parylene.

8. The organic electroluminescent apparatus of claim 1, wherein a thickness of the organic layer ranges from 0.5 to 2 micrometers.

* * * * *